United States Patent
Nishiwaki et al.

(12) 
(10) Patent No.: US 10,611,150 B2
(45) Date of Patent: Apr. 7, 2020

(54) LIQUID DISCHARGE HEAD, LIQUID DISCHARGE APPARATUS, PIEZOELECTRIC DEVICE, AND ULTRASONIC SENSOR

(71) Applicant: SEIKO EPSON CORPORATION, Tokyo (JP)

(72) Inventors: Tsutomu Nishiwaki, Azumino (JP); Hiroshi Kato, Okaya (JP); Tsutomu Asakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/127,770

(22) Filed: Sep. 11, 2018

(65) Prior Publication Data

US 2019/0077150 A1 Mar. 14, 2019

(30) Foreign Application Priority Data

Sep. 12, 2017 (JP) .................................. 2017-174648
Jan. 29, 2018 (JP) .................................. 2018-012688

(51) Int. Cl.
*B41J 2/14* (2006.01)
*H01L 41/09* (2006.01)
(Continued)

(52) U.S. Cl.
CPC ......... *B41J 2/14233* (2013.01); *B06B 1/0644* (2013.01); *H01L 41/0815* (2013.01);
(Continued)

(58) Field of Classification Search
CPC ................ B41J 2/14201; B41J 2/14233; B41J 2002/14241; B41J 2002/14266; B41J 2/1618; B41J 2202/03; B41J 2002/14419; B41J 2202/11; H01L 41/0815; H01L 41/0973; H01L 41/1132; B06B 1/0644
See application file for complete search history.

(56) References Cited

U.S. PATENT DOCUMENTS

| | | | | |
|---|---|---|---|---|
| 2012/0287206 | A1* | 11/2012 | Fielder | ................. B41J 2/14016 347/63 |
| 2014/0049582 | A1* | 2/2014 | Machida | ............. B41J 2/14233 347/68 |

(Continued)

FOREIGN PATENT DOCUMENTS

| | | |
|---|---|---|
| EP | 1749661 A2 | 7/2007 |
| JP | 2001341306 A | 11/2001 |

(Continued)

OTHER PUBLICATIONS

Extended European Search Report issued in Application No. 18194055 dated Apr. 23, 2019.

*Primary Examiner* — Geoffrey S Mruk
(74) *Attorney, Agent, or Firm* — Workman Nydegger

(57) ABSTRACT

A liquid discharge head includes a pressure chamber that accommodates a liquid, a diaphragm that forms a wall surface of the pressure chamber, and a piezoelectric element that is provided on an opposite side of the pressure chamber with the diaphragm interposed between the piezoelectric element and the pressure chamber and vibrates the diaphragm. The diaphragm includes a silicon oxynitride layer formed with including silicon oxynitride.

20 Claims, 11 Drawing Sheets

(51) Int. Cl.
  *B06B 1/06*  (2006.01)
  *H01L 41/08*  (2006.01)
  *H01L 41/113*  (2006.01)

(52) U.S. Cl.
  CPC . *H01L 41/0973* (2013.01); *B41J 2002/14419* (2013.01); *B41J 2202/03* (2013.01); *B41J 2202/11* (2013.01); *H01L 41/1132* (2013.01)

(56) References Cited

U.S. PATENT DOCUMENTS

| | | |
|---|---|---|
| 2015/0165479 A1 | 6/2015 | Lasiter et al. |
| 2016/0236470 A1 | 8/2016 | Mizukami |

FOREIGN PATENT DOCUMENTS

| | | |
|---|---|---|
| JP | 20100221528 A | 7/2010 |
| JP | 2013-65698 A | 4/2013 |
| JP | 2014060282 A | 4/2014 |
| JP | 2021154863 A | 8/2014 |
| JP | 2016-062984 A | 4/2016 |
| JP | 2016-150471 A | 8/2016 |

\* cited by examiner

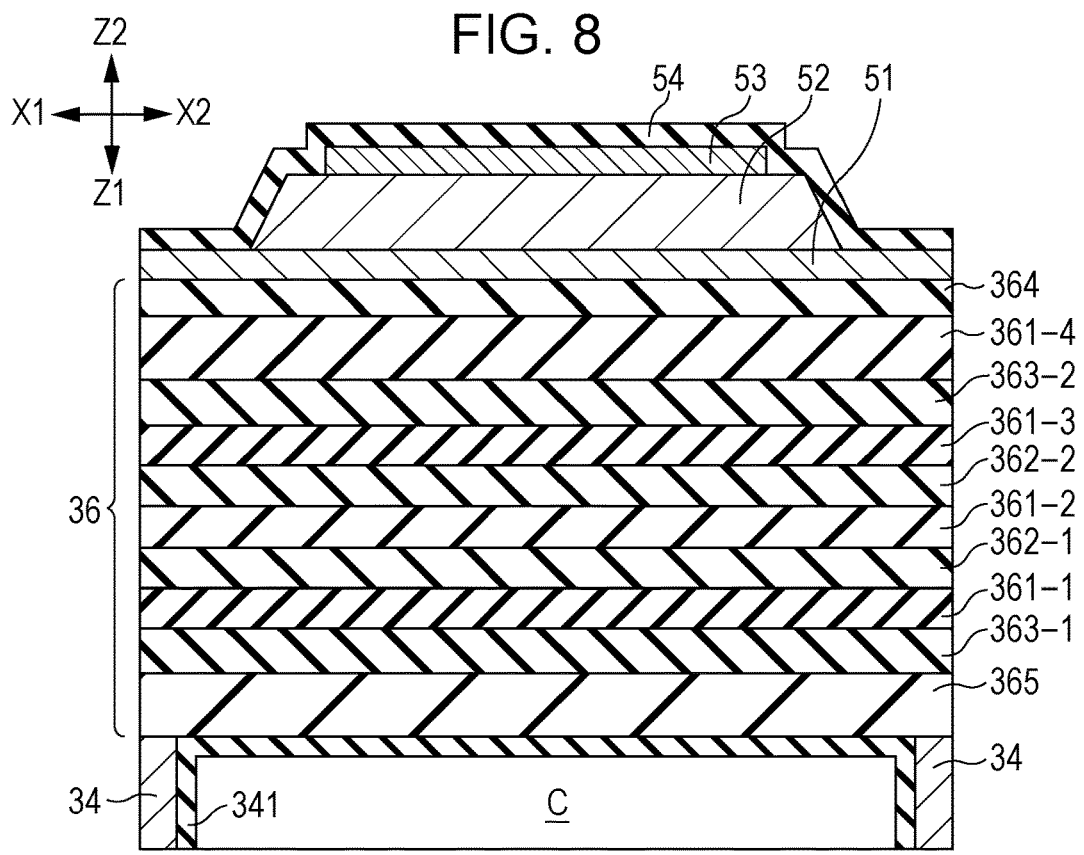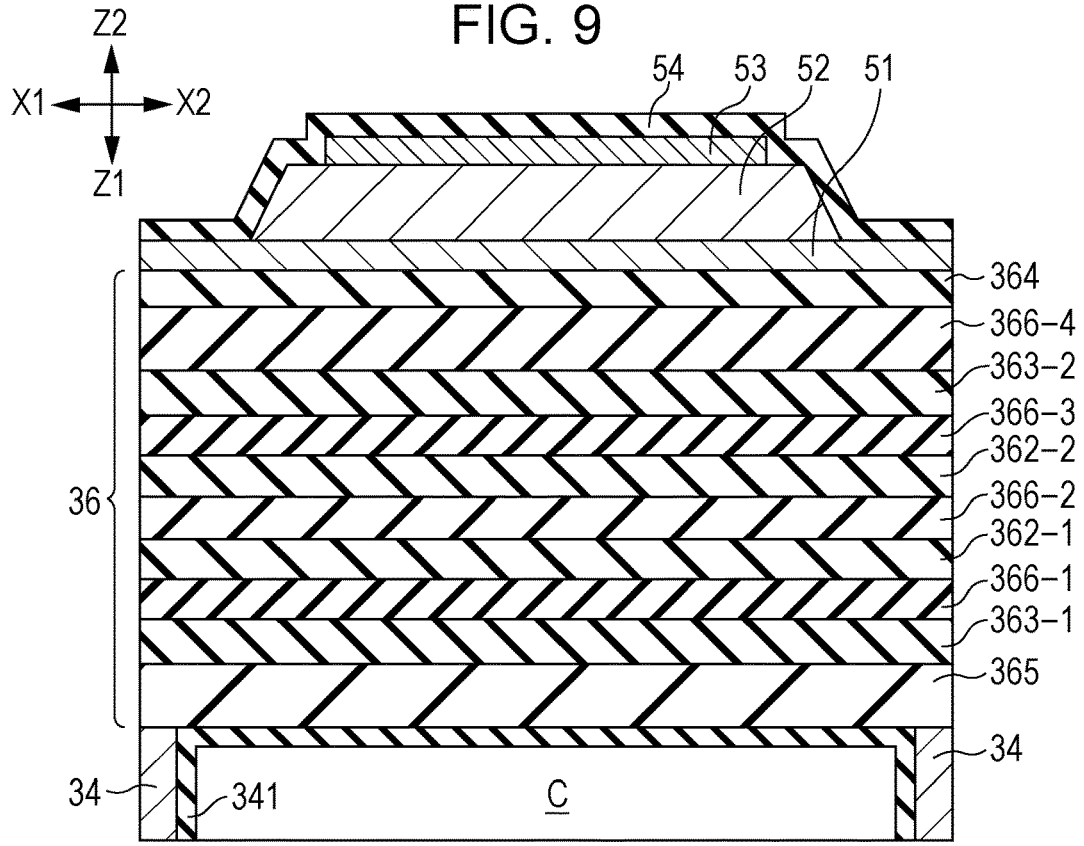

FIG. 10

| | EXAMPLE 1 | EXAMPLE 2 | EXAMPLE 3 | COMPARATIVE EXAMPLE |
|---|---|---|---|---|
| ELASTIC PLATE FUNCTION | ○ | ○ | ○ | △ |
| ADHESION FORCE | ◎ | ○ | ○ | △ |
| EASINESS OF MANUFACTURING | ◎ | ○ | △ | △ |
| REMAINING STRESS CONTROL | △ | ○ | ◎ | ◎ |

LIQUID DISCHARGE HEAD, LIQUID DISCHARGE APPARATUS, PIEZOELECTRIC DEVICE, AND ULTRASONIC SENSOR

The entire disclosure of Japanese Patent Application No. 2017-174648, filed Sep. 12, 2017 and 2018-012688, filed Jan. 29, 2018 are expressly incorporated by reference herein.

BACKGROUND

1. Technical Field

The present invention relates to, for example, a structure of a piezoelectric device which is suitably used in a liquid discharge head.

2. Related Art

A liquid discharge head that discharges a liquid in a pressure chamber from nozzles in a manner that a piezoelectric element vibrates a diaphragm that forms a wall surface of the pressure chamber has been proposed in the related art. The piezoelectric element includes a piezoelectric layer crystallized by baking. For example, JP-A-2016-150471 discloses a liquid discharge head which includes a diaphragm formed by stacking a polysilicon layer, a silicon oxide layer, and a silicon nitride layer.

However, in the configuration in JP-A-2016-150471, the piezoelectric layer is made of dense crystal. Thus, if the piezoelectric element is fired at a high temperature, the piezoelectric element and the diaphragm are easily separated from each other. Specifically, the linear expansion coefficient of an electrode provided in the piezoelectric element is largely different from the linear expansion coefficient of the diaphragm. Thus, if the piezoelectric element is fired at a high temperature, large thermal stress occurs between the electrode and the diaphragm, and the piezoelectric element and the diaphragm are easily separated from each other by the thermal stress.

SUMMARY

An advantage of some aspects of the invention is to suppress an occurrence of separation between the diaphragm and the piezoelectric element even in a case where the piezoelectric element is fired at a high temperature.

According to an aspect of the invention, a liquid discharge head includes a pressure chamber that accommodates a liquid, a diaphragm that forms a wall surface of the pressure chamber, and a piezoelectric element that is provided on an opposite side of the pressure chamber with the diaphragm interposed between the piezoelectric element and the pressure chamber and vibrates the diaphragm. The diaphragm includes a silicon oxynitride layer formed with including silicon oxynitride. The linear expansion coefficient of silicon oxynitride is closer to the linear expansion coefficient of an electrode of the piezoelectric element than the linear expansion coefficient of silicon oxide. Thus, in the liquid discharge head, the expansion degrees in firing are close to each other as much as the linear expansion coefficients are closed to each other. Thus, the thermal stress decreases, and thus it is possible to suppress separation between the piezoelectric element and the diaphragm. As the silicon oxynitride layer, a solid solution of silicon oxynitride, silicon nitride, and silicon oxide may be provided.

In the liquid discharge head, the diaphragm may include a silicon nitride layer which is formed of silicon nitride and is stacked on the silicon oxynitride layer. The Young's modulus of silicon nitride is higher than the Young's modulus of silicon oxynitride. The position of the material-mechanical neutral plane (simply referred to as "a neutral plane" below) of the diaphragm and the Young's modulus of the diaphragm are determined by the Young's modulus and the thickness of each of a plurality of layers in the diaphragm. Thus, in the liquid discharge head, it is possible to suitably set the position of the neutral plane and the Young's modulus by combining the silicon nitride layer having the high Young's modulus and the silicon oxynitride layer having the low Young's modulus and adjusting the thickness of each of the plurality of layers. Thus, the designer of the liquid discharge head can easily adjust the position of the neutral plane of the diaphragm and the Young's modulus of the diaphragm.

In the liquid discharge head, the silicon oxynitride layer may be stacked between the silicon nitride layer and a polysilicon layer formed by polysilicon. In the liquid discharge head, the designer of the liquid discharge head can easily adjust residual stress in the diaphragm by combining compressive stress occurring in the polysilicon layer and tensile stress occurring in the silicon nitride layer.

In the liquid discharge head, the diaphragm may include an adhesive layer positioned on an outermost layer on the piezoelectric element side. The adhesive layer may be formed on a surface of the silicon oxynitride layer which is formed with including the silicon oxynitride and is provided in the diaphragm. In the liquid discharge head, regarding the diaphragm including the adhesive layer, it is possible to suppress separation between the piezoelectric element and the diaphragm even in a case where a piezoelectric element is fired at a high temperature.

In the liquid discharge head, the piezoelectric element may be formed on a surface of the silicon oxynitride layer which is formed with including the silicon oxynitride and is provided in the diaphragm. Observing the adhesive layer may not be possible because the material of the adhesive layer is oxidized during firing and is diffused into an electrode of the piezoelectric element. In the liquid discharge head, even in a case where observing the adhesive layer is not possible because of being diffused into the electrode, it is possible to suppress separation between the piezoelectric element and the diaphragm.

In the liquid discharge head, the linear expansion coefficient of the silicon oxynitride layer may be from $1.0 \times 10^{-6}$/K to $2.0 \times 10^{-6}$/K. According to the above-described numerical range, the linear expansion coefficient of the silicon oxynitride layer is closer to the linear expansion coefficient of the electrode of the piezoelectric element than the linear expansion coefficient of silicon oxide. Thus, regarding the diaphragm in the liquid discharge head, even in a case where the piezoelectric element is fired at a high temperature, it is possible to suppress separation between the diaphragm and the piezoelectric element in comparison to a case where silicon oxide is employed as the material of the diaphragm.

In the liquid discharge head, the linear expansion coefficient of the silicon oxynitride layer may be from $1.5 \times 10^{-6}$/K to $2.0 \times 10^{-6}$/K. According to the above-described numerical range, the linear expansion coefficient of the silicon oxynitride layer is closer to the linear expansion coefficient of the electrode of the piezoelectric element than the linear expansion coefficient of the silicon oxynitride layer in the above configuration. Thus, regarding the diaphragm in the liquid discharge head, even in a case where the piezoelectric element is fired at a high temperature, it is possible to suppress separation between the diaphragm and the piezoelectric element in comparison to the liquid discharge head of the above configuration.

In the liquid discharge head, the percentage of a mass of nitrogen to the total mass of oxygen and the nitrogen in the silicon oxynitride layer may be from 20% to 90%. If the content of nitrogen is set to 0%, that is, the content of oxygen is set to 100%, an adhesion force to the electrode of the piezoelectric element can be obtained. However, since the Young's modulus decreases, thickening the diaphragm is required for securing the aimed displacement amount, and thus the function as an elastic plate is deteriorated. If the content of nitrogen is set to 100%, the Young's modulus increases, and thinning the diaphragm is possible, and thus the function as the elastic plate is improved. However, the adhesion force to the electrode of the piezoelectric element is weakened. Thus, as in the above-described liquid discharge head, if the percentage of the mass of nitrogen is set to be from 20% to 90%, regarding the diaphragm in this configuration, it is possible to obtain the adhesion force to the electrode of the piezoelectric element and to sufficiently secure the displacement amount of the diaphragm while the thickness of the diaphragm is reduced by increasing the Young's modulus. Accordingly, it is possible to improve the function as the elastic plate.

According to another aspect of the invention, a liquid discharge apparatus includes the liquid discharge head according to any of the above-described forms. As the preferred example of the liquid discharge apparatus, a printing device that discharges an ink is provided. However, the usage of the liquid discharge apparatus according to the invention is not limited to printing.

According to still another aspect of the invention, a piezoelectric device includes a diaphragm that forms a wall surface of a pressure chamber, and a piezoelectric element that is provided on an opposite side of the pressure chamber with the diaphragm interposed between the piezoelectric element and the pressure chamber and vibrates the diaphragm. The diaphragm includes a silicon oxynitride layer formed with including silicon oxynitride. The linear expansion coefficient of silicon nitride is closer to the linear expansion coefficient of an electrode of the piezoelectric element than the linear expansion coefficient of silicon oxide. Thus, in the liquid discharge head, the expansion degrees in firing are close to each other as much as the linear expansion coefficients are closed to each other. Thus, the thermal stress decreases, and thus it is possible to suppress separation between the piezoelectric element and the diaphragm.

According to still another aspect of the invention, an ultrasonic sensor includes the piezoelectric device described above. According to the above-described form, it is possible to provide an ultrasonic sensor that can suppress separation between the piezoelectric element and the diaphragm.

BRIEF DESCRIPTION OF THE DRAWINGS

The invention will be described with reference to the accompanying drawings, wherein like numbers reference like elements.

FIG. 8 is a sectional view when a diaphragm in Example 3 is taken along the line V-V in FIG. 4.

FIG. 9 is a sectional view when a diaphragm in Comparative Example is taken along the line V-V in FIG. 4.

FIG. 10 is a diagram illustrating an evaluation list for Examples 1 to 3 and Comparative Example.

DESCRIPTION OF EXEMPLARY EMBODIMENTS

Figure 1:
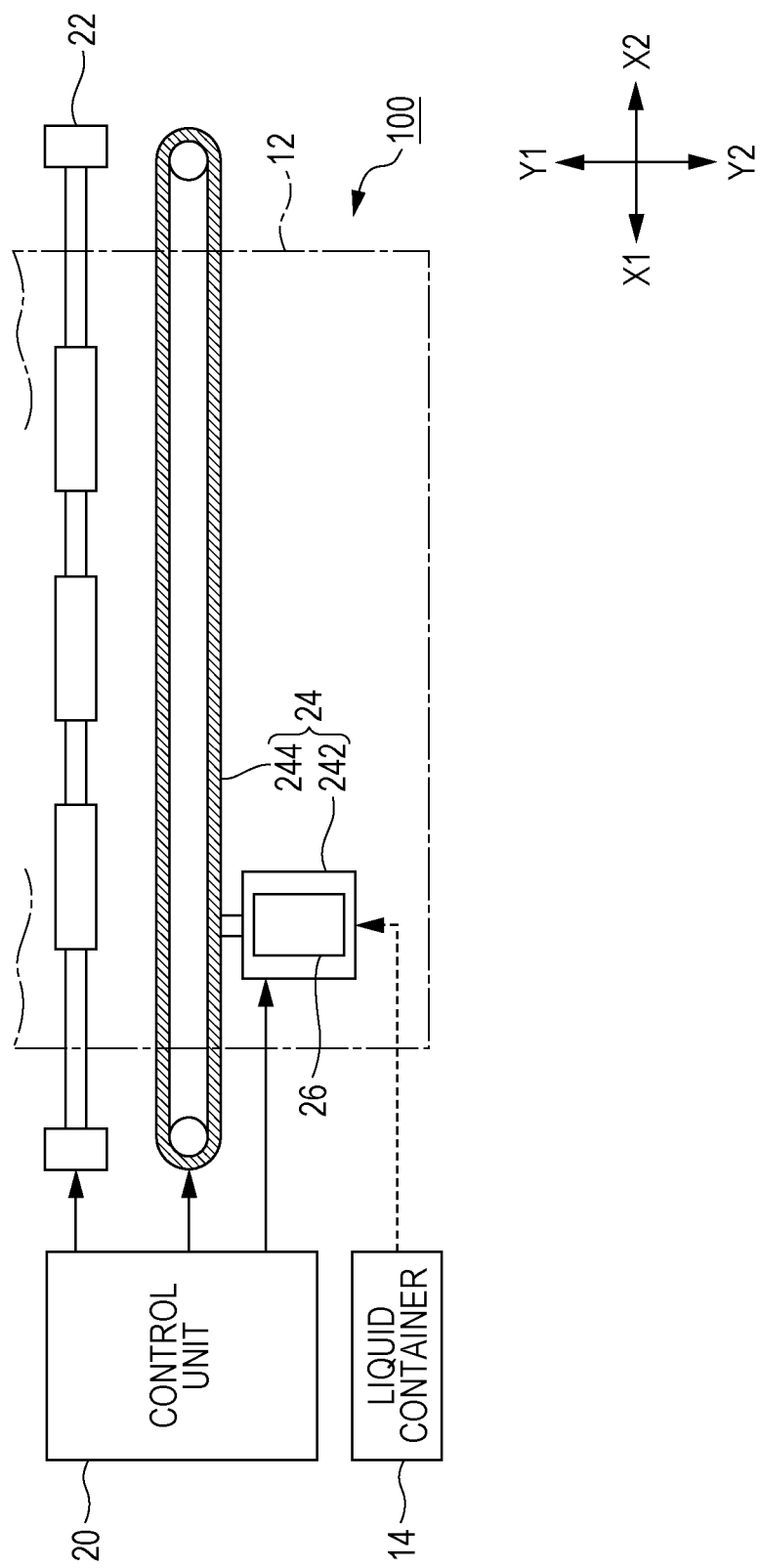
FIG. 1 is a configuration diagram illustrating a liquid discharge apparatus according to an embodiment of the invention.

Hereinafter, an embodiment for carrying out the invention will be described with reference to the drawings. The dimensions and the scale of each component in the drawings may be appropriately different from those of the practical component. Since the embodiment which will be described below is the preferred specific example of the invention, various limitations which are technically preferable are given. However, the scope of the invention is not limited to the following forms so long as descriptions of limiting the invention are not provided in the following descriptions.

Embodiment

FIG. 1 is a configuration diagram illustrating a liquid discharge apparatus 100 according to an embodiment of the invention. The liquid discharge apparatus 100 in the embodiment is an ink jet type printing device that discharges an ink as an example of a liquid to a medium (discharge target) 12. Typically, the medium 12 is printing paper. However, a print target of any material, such as a resin film or cloth, is used as the medium 12. As illustrated in FIG. 1, a liquid container 14 that stores an ink is installed in the liquid discharge apparatus 100. For example, a cartridge detachable from the liquid discharge apparatus 100, a bag-like ink pack formed with a flexible film, or an ink tank capable of replenishing the ink is used as the liquid container 14.

As illustrated in FIG. 1, the liquid discharge apparatus 100 includes a control unit 20, a transporting mechanism 22, a moving mechanism 24, and a liquid discharge head 26. For example, the control unit 20 includes a processing circuit such as a central processing unit (CPU) or a field programmable gate array (FPGA), and a storage circuit such as a semiconductor memory, and thus collectively controls the components of the liquid discharge apparatus 100. The transporting mechanism 22 transports the medium 12 in a Y-direction (Y1, Y2) based on a control of the control unit 20.

The moving mechanism 24 causes the liquid discharge head 26 to reciprocate in an X-direction (X1, X2), based on a control of the control unit 20. The X-direction is a direction intersecting (typically, orthogonal to) the Y-direction in which the medium 12 is transported. The moving mechanism 24 in the embodiment includes a transport body (carriage) 242 and a transporting belt 244. The transport body has a substantially-box shape and accommodates the liquid discharge head 26. The transport body 242 is fixed to the transporting belt 244. A configuration in which a plurality of liquid discharge heads 26 is mounted in the transport body 242 or a configuration in which the liquid container 14 is mounted in the transport body 242 along with the liquid discharge head 26 may be employed.

The liquid discharge head 26 discharges an ink supplied from the liquid container 14, from a plurality of nozzles (discharge holes) to the medium 12 based on a control of the control unit 20. Each of the liquid discharge heads 26 discharges the ink to the medium 12 in parallel with transportation of the medium 12 by the transporting mechanism 22 and repeated reciprocation of the transport body 242, and thus a desired image is formed on the surface of the medium 12.

Figure 2:
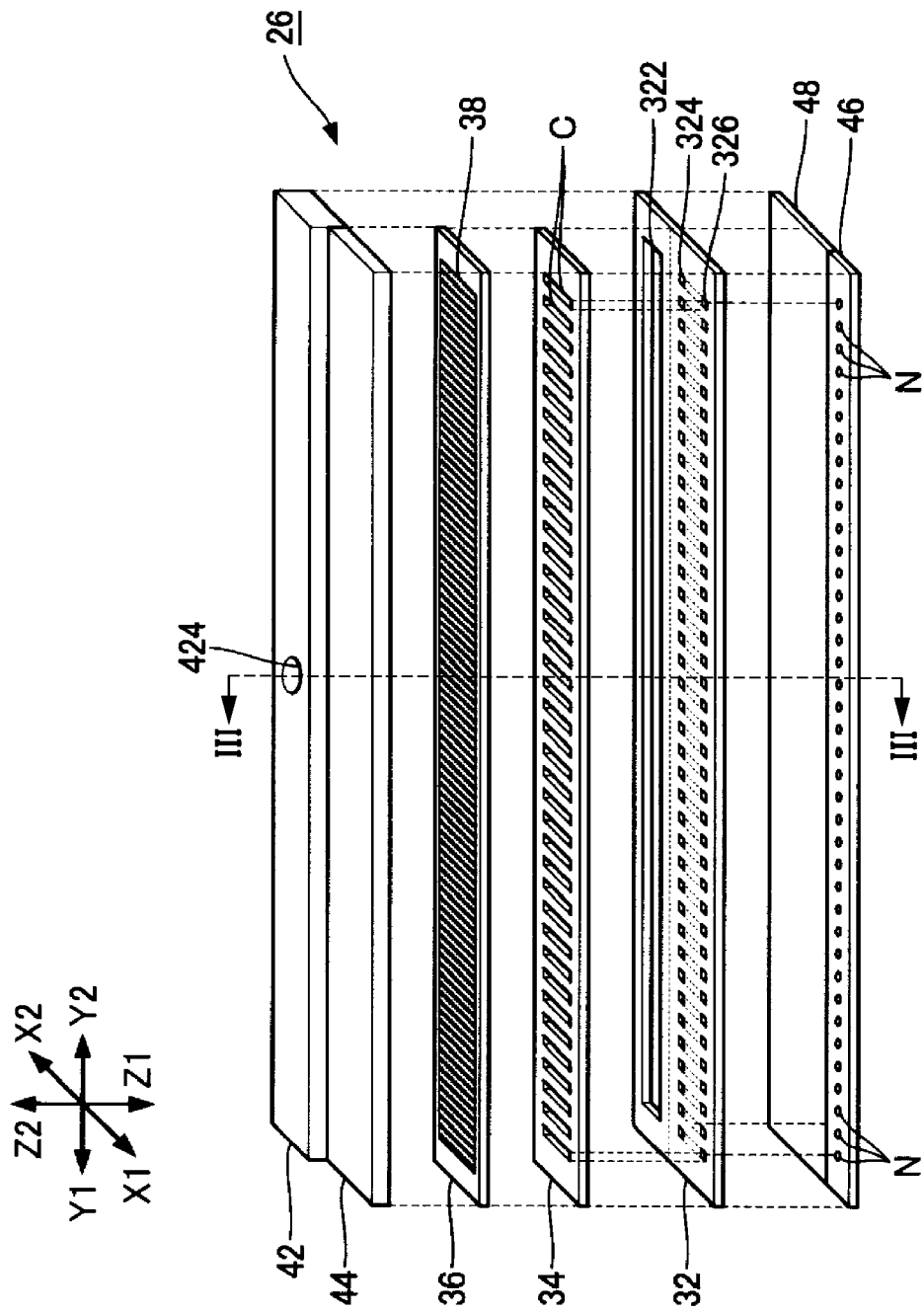
FIG. 2 is an exploded perspective view illustrating a liquid discharge head.
Figure 3:
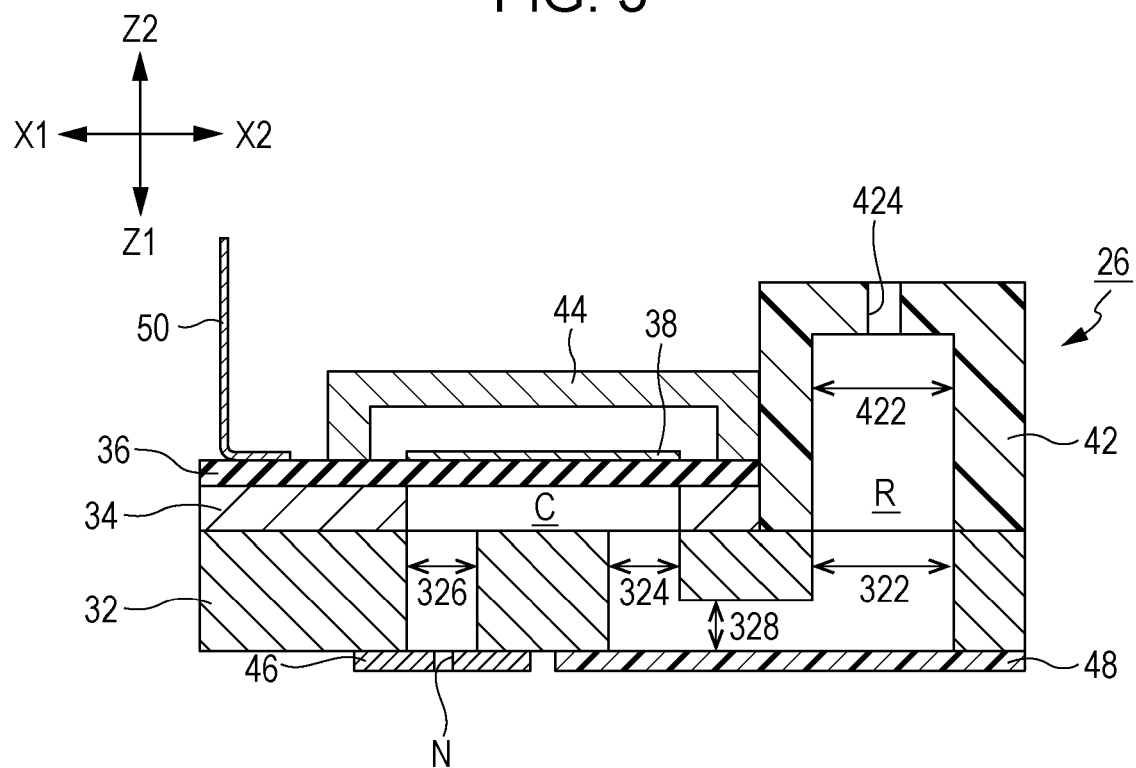
FIG. 3 is a sectional view taken along line III-III in FIG. 2.

FIG. 2 is an exploded perspective view illustrating the liquid discharge head 26. FIG. 3 is a sectional view taken along line III-III in FIG. 2 (section parallel to an X-Z plane). As illustrated in FIG. 2, a direction perpendicular to an X-Y plane (for example, plane parallel to the surface of the medium 12) is described as a Z-direction (Z1, Z2) below. A discharge direction (typically, vertical direction) of an ink by each of the liquid discharge heads 26 corresponds to the Z-direction. In the following descriptions, one side of the X-direction is described as "an X1 side", and the other side thereof is described as "an X2 side". Similarly, one side of the Y-direction is described as "a Y1 side", and the other side thereof is described as "a Y2 side". One side of the Z-direction is described as "a Z1 side", and the other side thereof is described as "a Z2 side".

As illustrated in FIGS. 2 and 3, the liquid discharge head 26 includes a flow passage substrate 32 which has a substantially rectangular shape which is elongated in the Y-direction. A pressure-chamber substrate 34, a diaphragm 36, a plurality of piezoelectric elements 38, a casing portion 42, and a sealing member 44 are installed over the surface of the flow passage substrate 32 on the Z2 side of the Z-direction. A nozzle plate 46 and a vibration absorption member 48 are installed on the surface of the flow passage substrate 32 on the Z1 side of the Z-direction. Schematically, the components of the liquid discharge head 26 are plate-like members which are elongated in the Y-direction similar to the flow passage substrate 32. The components thereof are bonded to each other by using an adhesive, for example.

As illustrated in FIG. 2, the nozzle plate 46 is a plate-like member in which a plurality of nozzles N are formed to be arranged in the Y-direction. The nozzles N are through-holes through which an ink passes. The flow passage substrate 32, the pressure-chamber substrate 34, and the nozzle plate 46 are formed in a manner that, for example, a single-crystal substrate of silicon (Si) is machined by a semiconductor manufacturing technology such as etching. The material and the manufacturing method of each of the components of the liquid discharge head 26 may be randomly determined. The Y-direction may also be referred to as a direction in which the plurality of nozzles N is arranged.

The flow passage substrate 32 is a plate-like member for forming a flow passage of an ink. As illustrated in FIGS. 2 and 3, an opening portion 322, a supply flow passage 324, and a communication flow passage 326 are formed in the flow passage substrate 32. The opening portion 322 is a through-hole formed along the Y-direction to continue over the plurality of nozzles N and to have an elongated shape in plan view (that is, when viewed from the Z-direction). The supply flow passage 324 and the communication flow passage 326 are through-holes which are formed for each of the nozzles N. As illustrated in FIG. 3, a relay flow passage 328 crossing over a plurality of supply flow passages 324 is formed on the surface of the flow passage substrate 32 on the Z1 side of the Z-direction. The relay flow passage 328 is a flow passage that causes the opening portion 322 to communicate with the plurality of supply flow passages 324.

The casing portion 42 is a structure body manufactured by injection molding of a resin material, for example. The casing portion is fixed to the surface of the flow passage substrate 32 on the Z2 side of the Z-direction. As illustrated in FIG. 3, an accommodation portion 422 and an inlet 424 are formed in the casing portion 42. The accommodation portion 422 is a recess portion having an external appearance corresponding to the opening portion 322 of the flow passage substrate 32. The inlet 424 is a through-hole that communicates with the accommodation portion 422. As understood from FIG. 3, a space in which the opening portion 322 of the flow passage substrate 32 communicates with the accommodation portion 422 of the casing portion 42 functions as a liquid storage chamber (reservoir) R. An ink which has been supplied from the liquid container 14 and then passed through the inlet 424 is stored in the liquid storage chamber R.

The vibration absorption member 48 is a component for absorbing pressure fluctuation in the liquid storage chamber R. For example, the vibration absorption member is formed to include a flexible sheet member (compliance substrate) that can elastically deform. Specifically, the vibration absorption member 48 is installed on the surface of the flow passage substrate 32 on the Z1 side of the Z-direction such that the bottom surface of the liquid storage chamber R is formed by closing the opening portion 322, the relay flow passage 328, and the plurality of supply flow passages 324 of the flow passage substrate 32.

As illustrated in FIGS. 2 and 3, the pressure-chamber substrate 34 is a plate-like member in which a plurality of pressure chambers C which respectively correspond to the nozzles N is formed. The plurality of pressure chambers C is arranged in the Y-direction. Each of the pressure chambers (cavities) C is an opening portion which is elongated along the X-direction in plan view. The end portion of the pressure chamber C on the X1 side of the X-direction overlaps one supply flow passage 324 in the flow passage substrate 32 in plan view. The end portion of the pressure chamber C on the X2 side of the X-direction overlaps one communication flow passage 326 in the flow passage substrate 32 in plan view.

The diaphragm 36 is formed on the surface of the pressure-chamber substrate 34 on an opposite side of the flow passage substrate 32. The diaphragm 36 is a plate-like member which can elastically deform. If a portion of a region corresponding to the pressure chamber C among the plate-like members having a predetermined plate thickness, in a plate thickness direction, is selectively removed, it is possible to integrally form some or all of the components of the pressure-chamber substrate 34 and the diaphragm 36.

As understood from FIG. 3, the flow passage substrate 32 and the diaphragm 36 face each other at a distance in each of the pressure chambers C. The pressure chamber C is a space which is positioned between the flow passage substrate 32 and the diaphragm 36 and is used for applying pressure to an ink with which the pressure chamber C is filled. The ink stored in the liquid storage chamber R is divided into the supply flow passage 324 from the relay flow passage 328, and then is supplied to the plurality of pressure chambers C and thus the plurality of pressure chambers C is filled with the ink. As understood from the above descriptions, the diaphragm 36 forms a wall surface of the pressure chamber C (specifically, upper surface which is a surface of the pressure chamber C).

As illustrated in FIGS. 2 and 3, a plurality of piezoelectric elements 38 which respectively correspond to the nozzles N (or pressure chambers C) is installed on the surface of the diaphragm 36 on an opposite side of the pressure chamber C. Each of the piezoelectric elements 38 is an actuator that deform when a driving signal is supplied. Each of the piezoelectric elements is formed to have an elongated shape in the X-direction in plan view. The plurality of piezoelectric elements 38 is arranged in the Y-direction to correspond to the plurality of pressure chambers C, respectively. If the diaphragm 36 vibrates with the piezoelectric element 38 deforming, pressure in the pressure chamber C fluctuates, and thus the ink with which the pressure chamber C is filled passes through the communication flow passage 326 and the nozzle N and then is discharged.

The sealing member 44 in FIGS. 2 and 3 is a structure body that protects the plurality of piezoelectric elements 38 and reinforces mechanical strength of the pressure-chamber substrate 34 and the diaphragm 36. The sealing member is fixed to the surface of the diaphragm 36 by, for example, an adhesive. The plurality of piezoelectric elements 38 is accommodated on the inside of the recess portion formed on a surface of the sealing member 44, which is opposite to the diaphragm 36.

As illustrated in FIG. 3, for example, a wiring substrate 50 is bonded to the surface of the diaphragm 36 (or the surface of the pressure-chamber substrate 34). The wiring substrate 50 is a surface-mounted component in which a plurality of wirings (not illustrated) for electrically connecting the control unit 20 or a power supply circuit (not illustrated) to the liquid discharge head 26 is formed. For example, a flexible wiring substrate 50 such as a flexible printed circuit (FPC) or a flexible flat cable (FFC) is suitably employed. A driving signal for driving the piezoelectric element 38 is supplied from the wiring substrate 50 to each of the piezoelectric elements 38.

Figure 4:
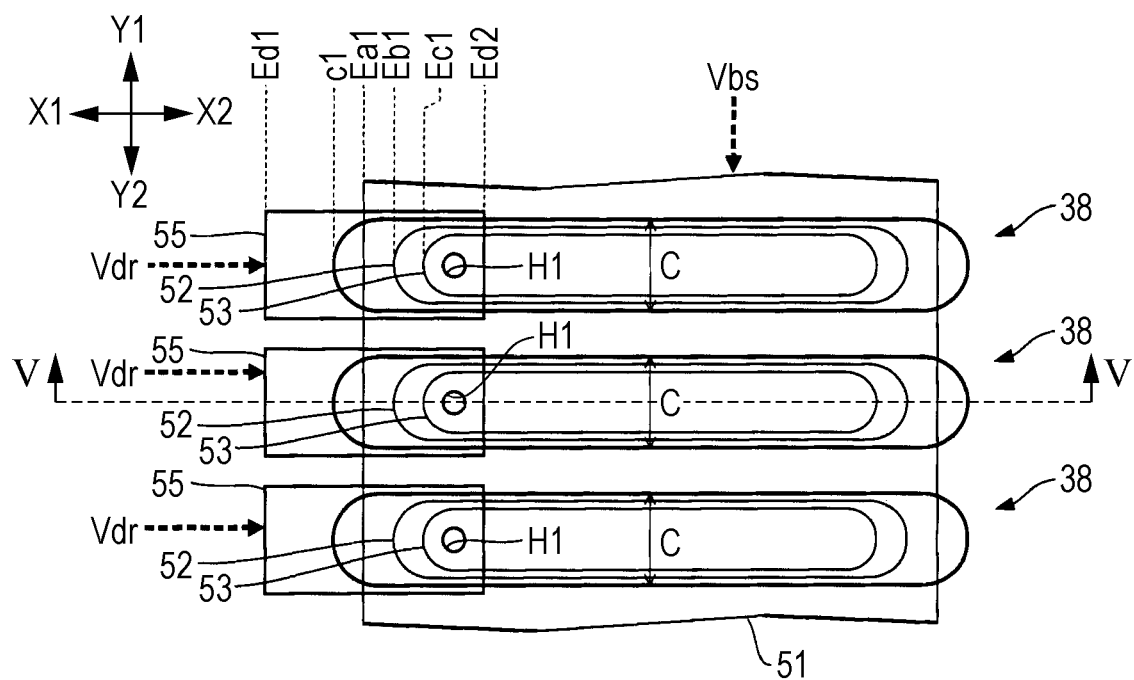
FIG. 4 is a plan view illustrating a plurality of piezoelectric devices.
Figure 5:
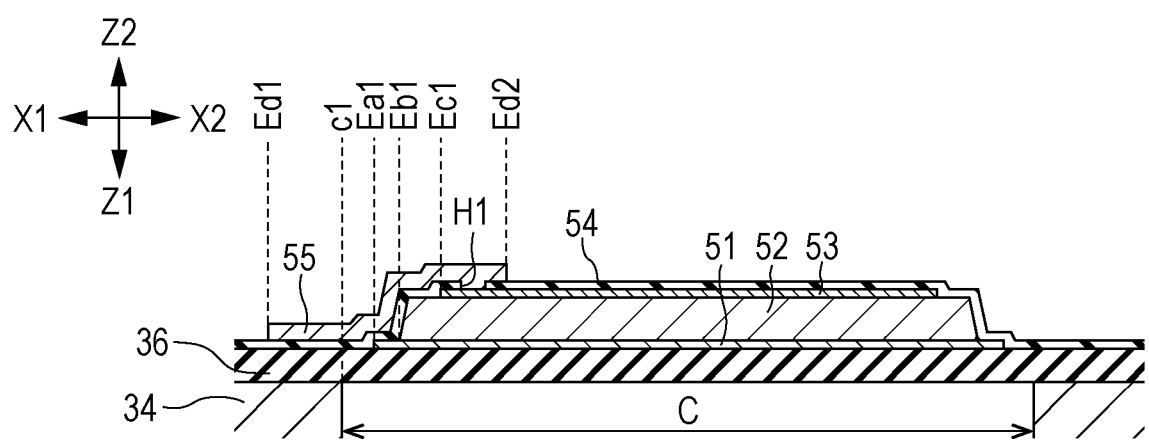
FIG. 5 is a sectional view taken along line V-V in FIG. 4.

The specific configuration of each of the piezoelectric elements 38 will be described below in detail. FIG. 4 is a plan view illustrating the plurality of piezoelectric elements 38. In FIG. 4, a circumference of any one component, which is positioned on the back side of the component (originally, portion hidden behind the component on the near side) is illustrated for convenience. FIG. 5 is a sectional view taken along line V-V in FIG. 4 (section taken along a longitudinal direction of the piezoelectric element 38). Here, the diaphragm 36 includes a plurality of layers. In FIG. 5, in order to avoid complication of the drawing, illustrations of the plurality of layers in the diaphragm 36 are omitted.

As illustrated in FIGS. 4 and 5, the piezoelectric element 38 is formed by stacking a first electrode 51, a piezoelectric layer 52, a second electrode 53, a protective layer 54, and a first wire 55. In the specification, an expression of "a component A and a component B are stacked" is not limited to the configuration in which the component A and the component B are directly in contact with each other. That is, a configuration in which another component C is interposed between the component A and component B is also conceptually included in the expression of "component A and component B are stacked". Similarly, an expression of "the component B being formed on the surface of the component A" is not limited to a configuration in which the component A and the component B are directly in contact with each other. That is, a configuration in which the component C is formed on the surface of the component A and the component B is formed on the surface of the component C is also conceptually included in the expression of "the component B being formed on the surface of the component A" so long as at least a portion of the component A overlaps the component B in plan view.

The first electrode 51 is formed over the surface of the diaphragm 36. Specifically, the first electrode 51 is a band-like common electrode extending in the Y-direction so as to continue over the plurality of piezoelectric elements 38 (or the plurality of pressure chambers C). A predetermined reference voltage Vbs is applied, for example, from the wiring substrate 50 to the end portion of the first electrode 51 in the Y-direction.

As illustrated in FIGS. 4 and 5, an end portion (circumference) Ea1 of the first electrode 51 on the X1 side of the X-direction is positioned on the X2 side when viewed from the end portion c1 of the pressure chamber C on the X1 side. That is, the end portion c1 of each of the pressure chambers C is positioned on the outside of a region in which the first electrode 51 is formed.

The piezoelectric layer 52 is formed on the first electrode 51. The piezoelectric layer 52 is individually formed for each of the piezoelectric elements 38 (or for each of the pressure chambers C) so as to overlap the pressure chamber C in plan view. That is, a plurality of piezoelectric layers 52 which are elongated in the X-direction is arranged at a distance in the Y-direction. The material or the manufacturing method of the piezoelectric layer 52 is randomly determined. For example, the piezoelectric layer 52 can be formed in a manner that a thin film of a piezoelectric material such as lead titanate zirconate is formed by a known film formation technology such as sputtering, and the thin film is selectively removed by a known processing technology such as photolithography and then is fired.

As illustrated in FIGS. 4 and 5, the end portion Eb1 of the piezoelectric layer 52 on the X1 side of the X-direction is positioned on the X2 side of the X-direction when viewed from the end portion Ea1 of the first electrode 51. As illustrated in FIGS. 4 and 5, each of the piezoelectric layers 52 is positioned on the inside of the region in which the first electrode 51 is formed.

The second electrode 53 is formed on the piezoelectric layer 52. The second electrode 53 is an individual electrode formed for each of the piezoelectric elements 38 (or for each of the pressure chambers C). Specifically, a plurality of second electrodes 53 extending in the X-direction is arranged at a distance in the Y-direction.

The material or the manufacturing method of the second electrode 53 is randomly determined. For example, the second electrode 53 can be formed in a manner that a thin film of a conductive material such as platinum (Pt) or iridium (Ir) is formed by a known film formation technology such as sputtering, and the thin film is selectively removed by a known processing technology such as photolithography. The second electrode 53 is positioned on the inside of the region in which the piezoelectric layer 52 is formed.

The end portion Ec1 of the second electrode 53 on the X1 side of the X-direction is positioned on the X2 side of the X-direction when viewed from the end portion Eb1 of the piezoelectric layer 52. The second electrode 53 is also positioned on the inner side of the piezoelectric layer 52 in the Y-direction. As understood from the above descriptions, the second electrode 53 is positioned on the inside of the region in which the piezoelectric layer 52 is formed.

As the piezoelectric element 38 in the embodiment, a unimorph type as illustrated in FIG. 5 is employed. The piezoelectric element 38 is separately formed for each of the pressure chambers C (for each of the nozzles N). The plurality of piezoelectric elements 38 which are elongated in the X-direction is arranged at a distance in the Y-direction. A portion (so-called active portion) of the piezoelectric layer 52, which is interposed between the first electrode 51 and the second electrode 53 deforms in accordance with a voltage distance between the reference voltage Vbs applied to the first electrode 51 and a driving signal Vdr supplied to the second electrode 53. The Z-direction may be also referred to as a direction in which the plurality of layers constituting the piezoelectric element 38 is stacked.

The protective layer 54 is an insulating film that covers the surface of the diaphragm 36, on which the plurality of piezoelectric elements 38 is formed. That is, the protective layer 54 covers the first electrode 51, the piezoelectric layer 52, and the second electrode 53. The protective layer 54 is formed of an insulating material such as Aluminum oxide ($Al_2O_3$), for example.

The first wire 55 refers to a conductive layer formed on the protective layer 54. The first wire 55 is separately formed for each of the piezoelectric elements 38 (or for each of the pressure chambers C). Specifically, a plurality of first wires 55 which are elongated in the X-direction is arranged at a distance in the Y-direction.

As illustrated in FIGS. 4 and 5, the first wire 55 is formed on the end portion X1 side of the piezoelectric layer 52. That is, the first wire 55 overlaps the end portion Eb1 of the piezoelectric layer 52 in plan view. Specifically, the end portion Ed1 of the first wire 55 on the X1 side of the X-direction is positioned on the X1 side of the X-direction when viewed from the end portion Ea1 of the first electrode 51. As understood from the above descriptions, the first wire 55 continues over the surfaces of the piezoelectric layer 52 and the second electrode 53 and a second portion S2 of the first electrode 51 (portion which does not overlap the piezoelectric layer 52). FIG. 4 illustrates a configuration in which the width of the first wire 55 is wider than the width of the piezoelectric layer 52. The wire width of the first wire 55 is randomly determined.

A portion of the first wire 55 on the end portion Ed2 side positioned on the surface of the piezoelectric layer 52 is electrically connected to the second electrode 53 via a contact hole H1 formed in the protective layer 54. A portion of the first wire 55 on the X1 side of the X-direction when viewed from the end portion Eb1 of the piezoelectric layer 52 overlaps the second portion S2 of the first electrode 51 with the protective layer 54 interposed between the portion of the first wire 55 and the second portion S2, in plan view. Thus, the first wire 55 (further, second electrode 53) and the first electrode 51 are electrically insulated from each other. The portion of the first wire 55 on the end portion Ed1 side is electrically connected to the wire of the wiring substrate 50. In the above configuration, the driving signal Vdr supplied from the wiring substrate 50 to the first wire 55 is supplied to the second electrode 53 via the first wire 55.

The first wires 55 are collectively formed by selectively removing a common conductive layer (single layer or a plurality of layers). Thus, the first wires 55 are formed of a common conductive material so as to have the substantially same film thickness. For example, the first wires 55 are collectively formed in a manner that a conductive layer of metal having low resistance such as gold is formed by a known film formation technology such as sputtering, and the conductive layer is selectively removed by a known processing technology such as photolithography. The film thickness of the first wire 55 is thicker than the film thickness of the second electrode 53. For example, the second electrode 53 is formed to have a sufficiently thin film thickness such that deformation of the piezoelectric layer 52 is not excessively suppressed. For the first wire 55, the film thickness as thick as wiring resistance is sufficiently reduced is secured.

EXAMPLES AND COMPARATIVE EXAMPLE

Examples (Examples 1 to 3) will be described below focusing on the detailed configuration of the diaphragm 36. The stacked structure (specifically, the number of stacked layers or the material of each of the layers) of the diaphragm 36 is different in Examples 1 to 3 illustrated in FIGS. 6 and 9. FIG. 9 illustrates a configuration of Comparative Example which is required to be compared to Examples. Diaphragms 36 in Examples 1 to 3 include silicon oxynitride, but the diaphragm 36 in Comparative Example does not include silicon oxynitride. In Examples 1 to 3 and Comparative Example, the materials of the first electrode 51 and the second electrode 53 are set to platinum. FIG. 10 illustrates an evaluation list for Examples 1 to 3 and Comparative Example. A table 200 illustrated in FIG. 10 shows evaluation results of evaluation items such as an elastic plate function of the diaphragm 36, the adhesion force, easiness of manufacturing, and residual stress control, for Examples 1 to 3 and Comparative Example. A double circle shown in Table 200 indicates the best evaluation among Examples 1 to 3 and Comparative Example. A single circle indicates the favorable evaluation next to the double circle. A triangle indicates the worst evaluation. Regarding the elastic plate function, the diaphragm 36 can become thinner as the Young's modulus become higher. Thus, the evaluation becomes more favorable as the Young's modulus of the diaphragm 36 becomes higher. Regarding the adhesion force, the evaluation becomes more favorable as the linear expansion coefficient of the layer in the diaphragm 36 on the Z2 side becomes closer to the linear expansion coefficient of the first electrode 51. Regarding the easiness of manufacturing, the evaluation becomes more favorable as the diaphragm 36 is manufactured easier. Regarding the residual stress control, the evaluation becomes more favorable as the residual stress occurring in the diaphragm 36 is adjusted easier.

Regarding the diaphragms 36 in Examples 1 to 3, the thickness of each of the layers of the diaphragm 36 that causes the neutral plane of the diaphragm 36 to be positioned in the first electrode 51 is shown. Here, the neutral plane is a virtual plane in which neither tensile stress nor compressive stress occurs. For example, if the neutral plane is in the piezoelectric layer 52, when the piezoelectric layer 52 is contracted in the X-direction, tensile stress occurs on the Z1 side by the neutral plane. Thus, the occurring tensile stress cancels a force of contracting the piezoelectric layer 52, and displacement efficiency is deteriorated. Thus, it is preferable that the neutral plane of the diaphragm 36 be positioned in the first electrode 51.

Example 1

Figure 6:
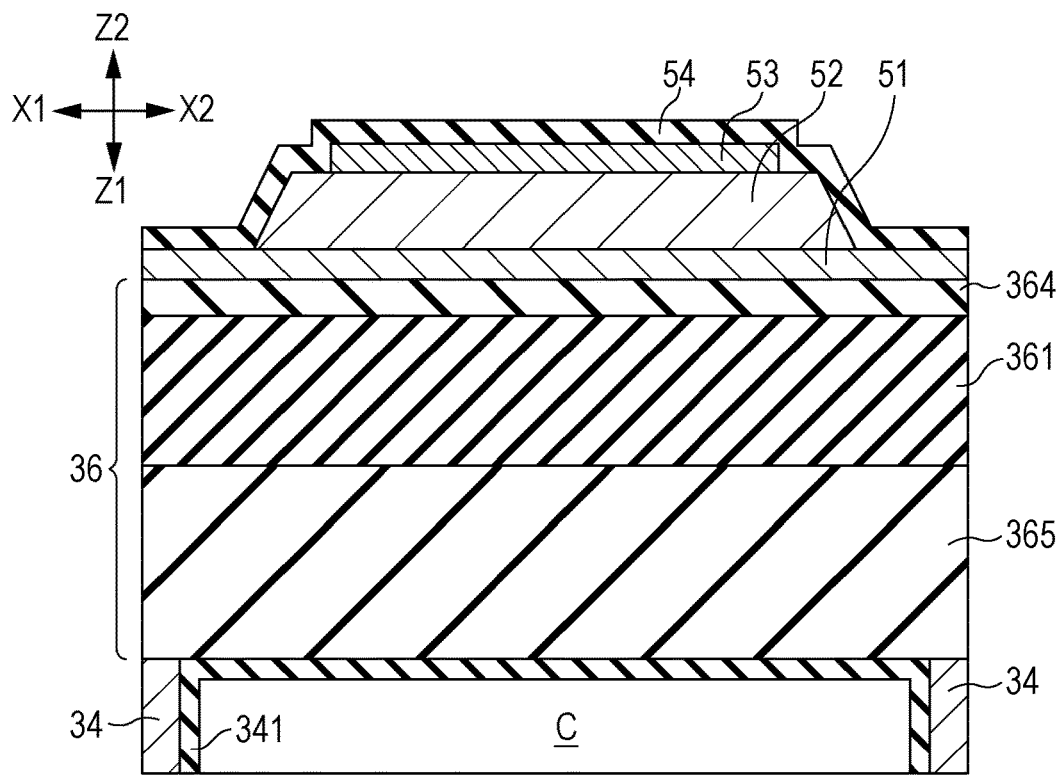
FIG. 6 is a sectional view when a diaphragm in Example 1 is taken along the line V-V in FIG. 4.

FIG. 6 is a sectional view when the diaphragm 36 in Example 1 is taken along the line V-V in FIG. 4. In FIG. 6, in order to avoid complication of the drawing, illustrations of the first wire 55 and the contact hole H1 are omitted. In Example 1, the diaphragm 36 is formed by stacking a silicon thermal oxide layer 365, a silicon oxynitride layer 361, and an adhesive layer 364 in an order from the pressure chamber C side. An ink protection layer 341 is stacked on the wall surface of the pressure chamber C (specifically, the lower surface of the diaphragm 36 and the inner wall surface of the pressure-chamber substrate 34). The neutral plane is calculated by using the Young's modulus and the thickness of each of the protective layer 54, the second electrode 53, the piezoelectric layer 52, the first electrode 51, the ink protection layer 341, and the plurality of layers constituting the diaphragm 36.

The thickness of the protective layer 54 is 30 nm, for example. The film thickness of the second electrode 53 is 50 nm, for example. The film thickness of the piezoelectric layer 52 is 1000 nm, for example. The film thickness of the first electrode 51 is 200 nm, for example. The adhesive layer 364 is formed on the surface of the silicon oxynitride layer 361. The adhesive layer 364 is formed, for example, of titanium oxide ($TiO_2$) obtained in a manner that titanium (Ti) is oxidized by firing the piezoelectric element 38. The thickness of the adhesive layer 364 is 30 nm, for example.

The silicon oxynitride layer 361 is a layer formed with including silicon oxynitride. The silicon oxynitride layer 361 may be a solid solution of silicon oxynitride, silicon nitride ($Si_3N_4$), and silicon oxide ($SiO_2$). The solid solution is not formed only of silicon nitride and is not formed only of silicon oxide. The thickness of the silicon oxynitride layer 361 is 300 nm, for example. The silicon thermal oxide layer 365 is a layer formed of silicon oxide obtained by performing thermal oxidation treatment on silicon. The thickness of the silicon thermal oxide layer 365 is 500 nm, for example. The ink protection layer 341 is a layer formed of tantalum oxide, for example. The thickness of the ink protection layer 341 is 50 nm, for example.

Example 2

Figure 7:
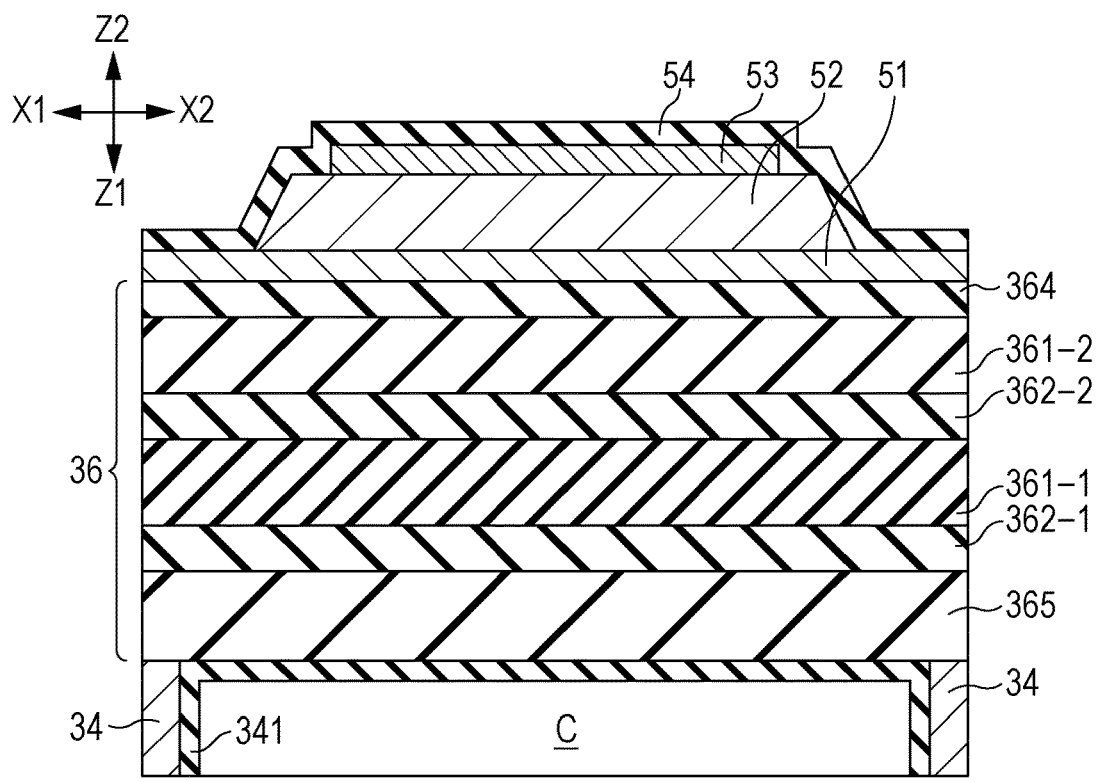
FIG. 7 is a sectional view when a diaphragm in Example 2 is taken along the line V-V in FIG. 4.

FIG. 7 is a sectional view when the diaphragm 36 in Example 2 is taken along the line V-V in FIG. 4. In FIG. 7, in order to avoid complication of the drawing, illustrations of the first wire 55 and the contact hole H1 are omitted. In Example 2, the diaphragm 36 is formed by stacking the silicon thermal oxide layer 365, a first silicon nitride layer 362-1, a first silicon oxynitride layer 361-1, a second silicon nitride layer 362-2, a second silicon oxynitride layer 361-2, and the adhesive layer 364 in an order from the pressure chamber C side. An ink protection layer 341 is stacked on the wall surface of the pressure chamber C (specifically, the lower surface of the diaphragm 36 and the inner wall surface of the pressure-chamber substrate 34). The neutral plane is calculated by using the Young's modulus and the thickness of each of the protective layer 54, the second electrode 53, the piezoelectric layer 52, the first electrode 51, the ink protection layer 341, and the plurality of layers constituting the diaphragm 36.

In the following descriptions, in a case where distinguishing the same type of components is required, the reference signs may be used like "the first silicon nitride layer 362-1" and "the second silicon nitride layer 362-2". In a case where the same type of components are collectively referred without distinguishment, only the common number from the reference signs may be used like "the silicon nitride layer 362".

The thickness of the protective layer 54 is 30 nm, for example. The film thickness of the second electrode 53 is 80 nm, for example. The film thickness of the piezoelectric layer 52 is 1200 nm, for example. The film thickness of the first electrode 51 is 160 nm, for example. The thickness of the adhesive layer 364 is 30 nm, for example.

The thickness of the second silicon oxynitride layer 361-2 is 200 nm, for example. The silicon nitride layer 362 is a layer formed of silicon nitride. The thickness of the second silicon nitride layer 362-2 is 150 nm, for example. The thickness of the first silicon oxynitride layer 361-1 is 200 nm, for example. The thickness of the first silicon nitride layer 362-1 is 150 nm, for example. The thickness of the silicon thermal oxide layer 365 is 300 nm, for example. The thickness of the ink protection layer 341 is 50 nm, for example.

In Example 2, the diaphragm 36 includes the second silicon nitride layer 362-2 stacked on the second silicon oxynitride layer 361-2, and the first silicon nitride layer 362-1 stacked on the first silicon oxynitride layer 361-1. Thus, the designer of the liquid discharge apparatus 100 can suitably set the position of the neutral plane and the Young's modulus by the diaphragm 36 by adjusting the thicknesses of the silicon oxynitride layer 361 having the low Young's modulus and the silicon nitride layer 362 having the high Young's modulus.

Example 3

FIG. 8 is a sectional view when the diaphragm 36 in Example 3 is taken along the line V-V in FIG. 4. In FIG. 8, in order to avoid complication of the drawing, illustrations of the first wire 55 and the contact hole H1 are omitted. In Example 3, the diaphragm 36 is formed by stacking the silicon thermal oxide layer 365, the first polysilicon layer 363-1, the first silicon oxynitride layer 361-1, the first silicon nitride layer 362-1, the second silicon oxynitride layer 361-2, the second silicon nitride layer 362-2, a third silicon oxynitride layer 361-3, a second polysilicon layer 363-2, a fourth silicon oxynitride layer 361-4, and the adhesive layer 364 in an order from the pressure chamber C side. An ink protection layer 341 is stacked on the wall surface of the pressure chamber C (specifically, the lower surface of the diaphragm 36 and the inner wall surface of the pressure-chamber substrate 34). The neutral plane is calculated by using the Young's modulus and the thickness of each of the protective layer 54, the second electrode 53, the piezoelectric layer 52, the first electrode 51, the ink protection layer 341, and the plurality of layers constituting the diaphragm 36.

The thickness of the protective layer 54 is 30 nm, for example. The film thickness of the second electrode 53 is 80 nm, for example. The film thickness of the piezoelectric layer 52 is 1200 nm, for example. The film thickness of the first electrode 51 is 180 nm, for example. The thickness of the adhesive layer 364 is 30 nm, for example.

The thickness of the fourth silicon oxynitride layer 361-4 is 200 nm, for example. The polysilicon layer 363 is a layer formed of polysilicon. The thickness of the second polysilicon layer 363-2 is 100 nm, for example. The thickness of the third silicon oxynitride layer 361-3 is 50 nm, for example. The thickness of the second silicon nitride layer 362-2 is 100 nm, for example. The thickness of the second silicon oxynitride layer 361-2 is 50 nm, for example. The thickness of the first silicon nitride layer 362-1 is 100 nm, for example. The thickness of the first silicon oxynitride layer 361-1 is 50 nm, for example. The thickness of the first polysilicon layer 363-1 is 100 nm, for example. The thickness of the silicon thermal oxide layer 365 is 300 nm, for example. The thickness of the ink protection layer 341 is 50 nm, for example.

In the diaphragm 36 in Example 3, the first silicon oxynitride layer 361-1 is stacked between the first polysilicon layer 363-1 and the first silicon nitride layer 362-1. The third silicon oxynitride layer 361-3 is stacked between the second polysilicon layer 363-2 and the second silicon nitride layer 362-2. The designer of the liquid discharge apparatus 100 can easily adjust the residual stress in the diaphragm 36 by combining compressive stress occurring in the polysilicon layer 363 and tensile stress occurring in the silicon nitride layer 362.

Comparative Example

FIG. 9 is a sectional view when the diaphragm 36 in Comparative Example is taken along the line V-V in FIG. 4. In FIG. 9, in order to avoid complication of the drawing, illustrations of the first wire 55 and the contact hole H1 are omitted. In Comparative Example, the diaphragm 36 is configured from the adhesive layer 364, a silicon oxide layer 366, the polysilicon layer 363, the silicon nitride layer 362, and the silicon thermal oxide layer 365. More specifically, in Comparative Example, the diaphragm 36 is formed by stacking the silicon thermal oxide layer 365, the first polysilicon layer 363-1, the first silicon oxide layer 366-1, the first silicon nitride layer 362-1, the second silicon oxide layer 366-2, the second silicon nitride layer 362-2, the third silicon oxide layer 366-3, the second polysilicon layer 363-2, the fourth silicon oxide layer 366-4, and the adhesive layer 364 in an order from the pressure chamber C side. Evaluation items for Examples 1 to 3 and Comparative Example Regarding the elastic plate function, as shown in Table 200, the diaphragms 36 in Examples 1 to 3 include silicon oxynitride having the Young's modulus which is greater than that of silicon oxide, in comparison to the diaphragm 36 in Comparative Example. Thus, it is possible to form a hard and thin elastic plate.

For the adhesion force, regarding the diaphragms 36 in Examples 1 to 3, the linear expansion coefficient of the silicon oxynitride layer 361 having a surface on which the adhesive layer 364 is formed is greater than the linear expansion coefficient of silicon oxide in Comparative Example. Thus, as shown in Table 200, the diaphragms 36 in Examples 1 to 3 have an adhesion force higher than that of the diaphragm 36 in Comparative Example. Thus, it is possible to suppress separation between the diaphragm 36 and the piezoelectric element 38.

Regarding easiness of manufacturing, the diaphragm 36 in Example 1 has the smallest number of layers, and thus is manufactured easiest. More specifically, the layers on the Z2 side of the silicon thermal oxide layer 365 of the diaphragm 36 are formed by a chemical vapor deposition (CVD) method. For example, a radio frequency (RF) plasma CVD device is used for forming the silicon oxynitride layer 361. The silicon oxynitride layer 361 having a desired composition and a desired film thickness can be formed by controlling a flow rate of a raw material gas into a film formation chamber of the RF plasma CVD device. As the raw material gas in a case of forming the silicon oxynitride layer 361, $SiH_4$, $N_2O$, $N_2$, $O_2$, or the like is suitably used. In the CVD method, as described above, the raw material gas including the material of each of the layers is supplied. As the number of layers becomes smaller, the number of times of switching the raw material gas becomes smaller. Thus, the diaphragm 36 in Example 1 is manufactured easiest.

Regarding the residual stress control, in the diaphragm 36 in Example 3, it is possible to easily adjust the residual stress by combining the compressive stress occurring in the first polysilicon layer 363-1 and the tensile stress occurring in the first silicon nitride layer 362-1. In the diaphragm 36 in Example 3, the layers are stacked line-symmetrically by using the second silicon oxynitride layer 361-2 as the center axis. Specifically, the first silicon nitride layer 362-1 and the second silicon nitride layer 362-2 are stacked line-symmetrically, the first silicon oxynitride layer 361-1 and the third silicon oxynitride layer 361-3 are stacked line-symmetrically, and the first polysilicon layer 363-1 and the second polysilicon layer 363-2 are stacked line-symmetrically, by using the second silicon oxynitride layer 361-2 as the center axis. Since the layers are stacked line-symmetrically, the designer of the liquid discharge apparatus 100 can easier adjust the residual stress in the diaphragm 36.

The reason that the residual stress in the diaphragm 36 is easier adjusted by stacking the layers line-symmetrically will be described. In a case where the layers are not stacked line-symmetrically, residual stress such as compressive stress or tensile stress may occur by a difference in linear expansion coefficient between the layers, and warpage or deformation may occur by the residual stress. In a case where the layers are stacked line-symmetrically, residual stresses which are opposite to each other occur around the axis of symmetry, and thus the residual stresses are canceled. Thus, warpage or deformation occurs less frequently.

In the diaphragm 36 in Example 2, the first silicon nitride layer 362-1 and the second silicon nitride layer 362-2 are stacked line-symmetrically by using the first silicon oxynitride layer 361-1 as the center axis. Thus, the designer of the liquid discharge apparatus 100 can easier adjust the residual stress in the diaphragm 36 in comparison to that in the diaphragm 36 in Example 1.

Advantageous Effect of Embodiment

As illustrated in FIGS. 6 to 8, the diaphragms 36 in Examples 1 to 3 include the silicon oxynitride layer 361. The linear expansion coefficient of the silicon oxynitride layer 361 decreases as the content of oxygen becomes greater and increases as the content of nitrogen becomes greater. The linear expansion coefficient of the silicon oxynitride layer 361 is greater than the linear expansion coefficient (=0.5× $10^{-6}$/K) of silicon oxide and is close to the linear expansion coefficient (=8.9× $10^{-6}$/K) of the first electrode 51. Thus, even in a case where a piezoelectric element 38 is fired at a high temperature, it is possible to suppress separation between the piezoelectric element 38 and a diaphragm 36 by using the diaphragm 36 including the silicon oxynitride layer 361, in comparison to a case where silicon oxide is used as a material of the diaphragm 36. The high temperature refers to a temperature in a range from 700 degrees to 800 degrees, for example.

The material of the piezoelectric element 38 can come to dense crystal by firing the piezoelectric element 38 at a high temperature. Since the material of the piezoelectric element 38 comes to dense crystal, the piezoelectric element 38 can have a high piezoelectric characteristic. The piezoelectric characteristic means the displacement amount of the piezoelectric element 38 with respect to a certain voltage, for example. The high piezoelectric characteristic indicates the large displacement amount with respect to a certain voltage.

Since the material of the piezoelectric element 38 comes to dense crystal, it is possible to suppress an occurrence of cracks which may occur by repetitive deformation. Thus, it is possible to obtain the piezoelectric element 38 with high reliability. Further, the Young's modulus of silicon oxynitride is 239 GPa, but the Young's modulus of silicon oxide is 75 GPa. Thus, it is possible to form a diaphragm 36 having a high elastic modulus and a thinner thickness.

As illustrated in FIGS. 7 and 8, the diaphragms 36 in Examples 2 and 3 include the silicon nitride layer 362 stacked on the silicon oxynitride layer 361. The Young's modulus of silicon oxynitride is 239 GPa, but the Young's modulus of silicon nitride is 300 GPa. That is, the Young's modulus of silicon nitride is higher than the Young's modulus of silicon oxynitride. It is possible to suitably set the position of the neutral plane and the Young's modulus by combining the silicon nitride layer 362 having the high Young's modulus and the silicon oxynitride layer 361 having the low Young's modulus and adjusting the thickness of each of the layers. Accordingly, the designer of the liquid discharge apparatus 100 can easily adjust the position of the neutral plane of the diaphragm 36 and the Young's modulus of the diaphragm.

As illustrated in FIG. 8, the silicon oxynitride layer 361 in the diaphragm 36 in Example 3 is stacked between the polysilicon layer 363 and the silicon nitride layer 362. The designer of the liquid discharge apparatus 100 can easily adjust residual stress by combining compressive stress occurring in the polysilicon layer 363 and tensile stress occurring in the silicon nitride layer 362.

As illustrated in FIGS. 6 to 8, the diaphragms 36 in Examples 1 to 3 include the adhesive layer 364 positioned on the outermost layer of the diaphragm 36 on the piezoelectric element 38 side. The adhesive layer 364 is formed on the surface of the silicon oxynitride layer 361. Thus, regarding the diaphragm 36 including the adhesive layer 364, even in a case where the piezoelectric element 38 is fired at a high temperature, it is possible to suppress separation between the piezoelectric element 38 and the diaphragm 36. It is possible to strengthen the adhesion force between the piezoelectric element 38 and the diaphragm 36 by using the adhesive layer 364, in comparison to a case where the adhesive layer 364 is not used. Here, the adhesion force between two layers is strengthened if a common element is included in the two layers. Thus, since the adhesive layer 364 is made of oxide, both the adhesive layer 364 and the silicon oxynitride layer 361 are made of oxide, and thus it is possible to strength the adhesion force.

Preferably, the linear expansion coefficient of the silicon oxynitride layer 361 is from $1.0 \times 10^{-6}$/K to $2.0 \times 10^{-6}$/K. According to the above-described numerical range, the linear expansion coefficient of the silicon oxynitride layer 361 is greater than the linear expansion coefficient ($=0.5 \times 10^{-6}$/K) of silicon oxide, and thus is closer to the linear expansion coefficient ($=8.9 \times 10^{-6}$/K) of the first electrode 51 than the linear expansion coefficient of silicon oxide. Thus, in the diaphragm 36 in the embodiment, even in a case where the piezoelectric element 38 is fired at a high temperature, it is possible to suppress separation between the diaphragm 36 and the piezoelectric element 38 in comparison to a case where silicon oxide is employed as the material of the diaphragm 36.

More preferably, the linear expansion coefficient of the silicon oxynitride layer 361 is from $1.5 \times 10^{-6}$/K to $2.0 \times 10^{-6}$/K. If the linear expansion coefficient of the silicon oxynitride layer 361 is from $1.5 \times 10^{-6}$/K to $2.0 \times 10^{-6}$/K, the linear expansion coefficient of the silicon oxynitride layer is closer to the linear expansion coefficient of the first electrode 51. Thus, even in a case where the piezoelectric element 38 is fired at a high temperature, it is possible to more suppress separation between the diaphragm 36 and the piezoelectric element 38.

The percentage of the mass of nitrogen to the total mass of oxygen and nitrogen included in the silicon oxynitride layer 361 is preferably from 20% to 90%. If the content of nitrogen is set to 0%, that is, the content of oxygen is set to 100%, the adhesion force to the first electrode 51 can be obtained. However, since the Young's modulus decreases, thickening the diaphragm 36 is required for securing the aimed displacement amount, and thus the function as the elastic plate is deteriorated. If the content of nitrogen is set to 100%, the Young's modulus increases, and thinning the diaphragm 36 is possible, and thus the function as the elastic plate is improved. However, the adhesion force to the first electrode 51 is weakened.

Thus, if the percentage of the mass of nitrogen included in the silicon oxynitride layer 361 is set to be from 20% to 90%, regarding the diaphragm 36 in the embodiment, it is possible to obtain the adhesion force to the first electrode 51 and to sufficiently secure the displacement amount of the diaphragm 36 while the thickness of the diaphragm 36 is reduced by increasing the Young's modulus. Accordingly, it is possible to improve the function as the elastic plate.

Regarding the linear expansion coefficient of the silicon oxynitride layer 361, the linear expansion coefficient in a case where the percentage of the mass of nitrogen is 0% is $0.5 \times 10^{-6}$/K, and the linear expansion coefficient in a case where the percentage of the mass of nitrogen is 100% is $2.5 \times 10^{-6}$/K. As the content of nitrogen increases, the linear expansion coefficient of the silicon oxynitride layer 361 increases. Thus, if the percentage of the mass of nitrogen is set to from 20% to 90%, it is possible to cause the linear expansion coefficient of the silicon oxynitride layer 361 to be in a numerical range in which separation between the diaphragm 36 and the piezoelectric element 38 can be suppressed.

Modification Example

Various modifications of the above forms can be made. Specific modifications will be described as an example. Two forms or more which are randomly selected from the following examples may be appropriately combined in a range without being contradictory to each other. The reference signs used in the above descriptions are utilized for actions or functions in the modification example as follows, which are equivalent to those in the embodiment, and detailed descriptions thereof will not be repeated.

(1) In the above-described forms, the adhesive layer 364 is formed on the surface of the silicon oxynitride layer 361. However, observing the adhesive layer 364 may not be possible because the material of the adhesive layer is oxidized during firing and is diffused into the first electrode 51. Thus, the first electrode 51 may be formed on the surface of the silicon oxynitride layer 361 without the existence of the adhesive layer 364 after firing. Even in a case where the material of the adhesive layer is diffused into the first electrode 51, and thus observing the adhesive layer 364 may not be possible, it is possible to suppress separation between the piezoelectric element 38 and the diaphragm 36. In the above-described forms, the material of the adhesive layer 364 is titanium oxide, but it is not limited thereto. The material of the adhesive layer may be iridium oxide or tin oxide.

(2) In the above-described forms, the band-like first electrode 51 that continues over the plurality of piezoelectric elements 38 is described as an example. However, the planar shape of the first electrode 51 is not limited to the above-described example. For example, the first electrode 51 may be separately formed for each of the piezoelectric elements 38. In the configuration in which the first electrode 51 is set to be an individual electrode, the piezoelectric layer 52 is formed on an inner side of a region in which the first electrodes 51 are formed.

(3) The planar shape of the pressure chamber C or the piezoelectric element 38 is not limited to the above-described examples. For example, in a configuration in which a single crystal substrate made of silicon (Si) is used as the pressure-chamber substrate 34, in practice, a crystal plane is reflected in the planar shape of the pressure chamber C.

(4) In the above-described forms, the serial type liquid discharge apparatus 100 that reciprocates the transport body 242 on which the liquid discharge head 26 is mounted is described as an example. However, the invention can also be applied to a line type liquid discharge apparatus in which a plurality of nozzles N is distributed over the entire width of a medium 12.

(5) The liquid discharge apparatus 100 described in the above-described forms may be employed as various devices such as a facsimile machine and a copy machine in addition to a device dedicated for printing. The usage of the liquid discharge apparatus in the invention is not limited to printing. For example, a liquid discharge apparatus that discharges a solution of a color material is used as a manufacturing device that forms a color filter of a liquid crystal display device. A liquid discharge apparatus that discharges a solution of a conductive material is used as a manufacturing device that forms a wire of a wiring substrate or an electrode.

(6) A piezoelectric device including the piezoelectric element 38 and the diaphragm 36 which are described in the above-described forms can be applied to other piezoelectric devices such as an ultrasonic sensor, an ultrasonic transducer, an ultrasonic motor, a pressure sensor, or a pyroelectric sensor in addition to the liquid discharge head 26. In such other piezoelectric devices, it is possible to suppress separation between the piezoelectric element and the diaphragm. A case of applying the piezoelectric device to an ultrasonic sensor will be described below with reference to FIGS. 11 to 13.

Figure 11:
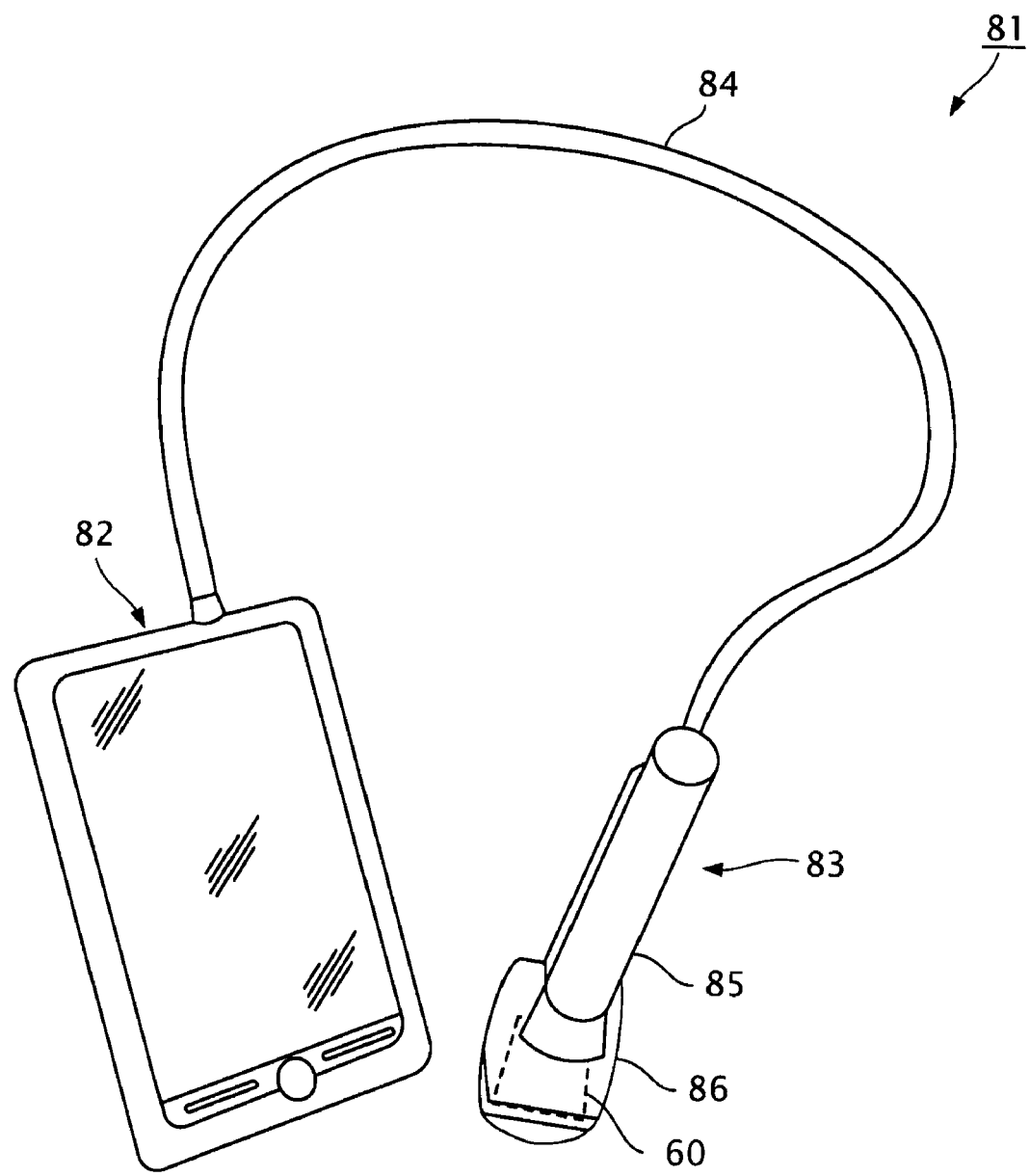
FIG. 11 is an external view illustrating an example of an ultrasonic diagnostic apparatus including an ultrasonic sensor.
Figure 12:
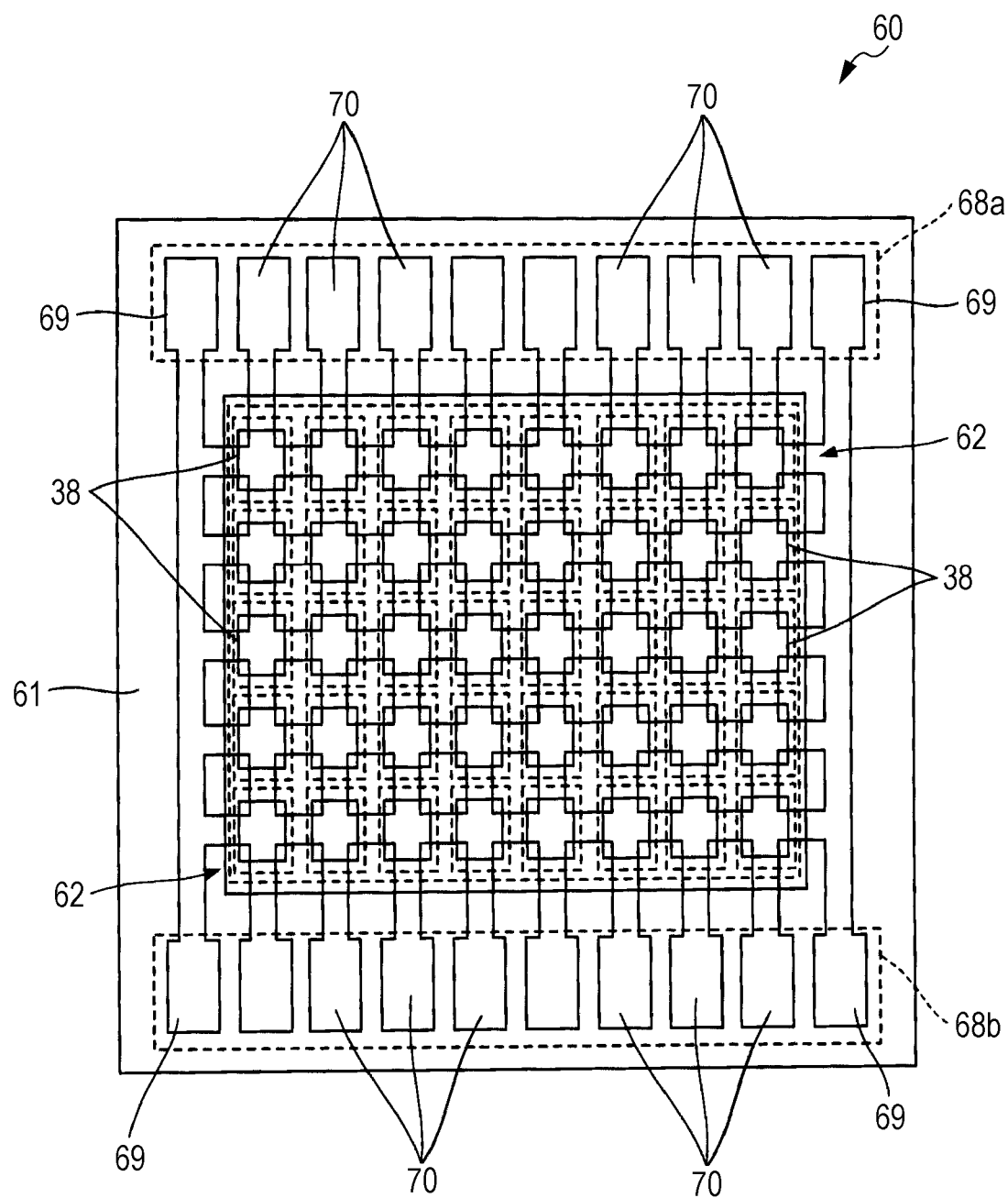
FIG. 12 is a plan view illustrating a piezoelectric device in the ultrasonic sensor.
Figure 13:
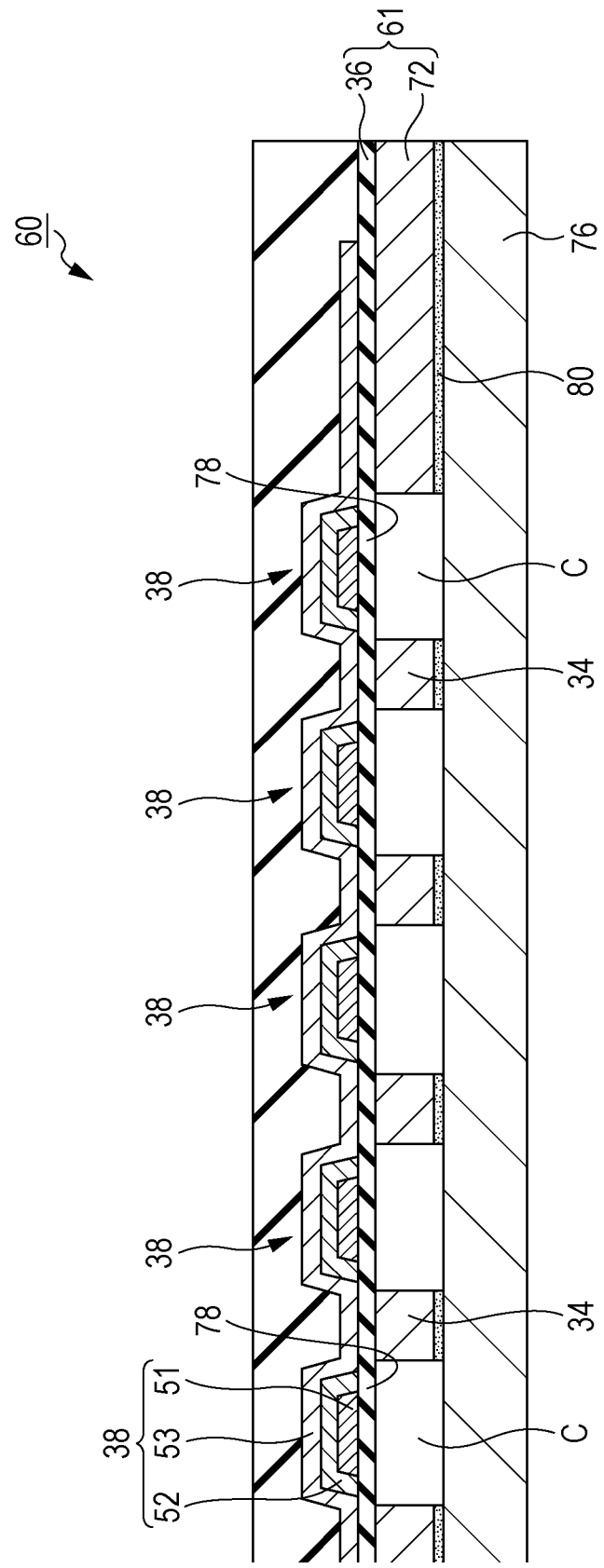
FIG. 13 is a sectional view illustrating the piezoelectric device in the ultrasonic sensor.

FIG. 11 is a diagram illustrating a configuration of an ultrasonic diagnostic apparatus 81 including an ultrasonic sensor 60 as one of the piezoelectric devices. FIG. 12 is a plan view illustrating an example of the ultrasonic sensor 60. FIG. 13 is a main sectional view of the ultrasonic sensor 60 in a row direction (horizontal direction in FIG. 12). In the above-described forms, a configuration in which an ink as one kind of liquid is ejected from nozzles by displacing a movable region is described. However, it is not limited thereto. The invention can also be applied to a sensor and the like that detect vibration (displacement) of a movable region as in the ultrasonic sensor 60. Therefore, the space in the invention is not limited to a usage of a liquid flowing.

The ultrasonic diagnostic apparatus 81 illustrated in FIG. 11 includes a terminal device 82 and an ultrasonic probe 83. The terminal device 82 and the ultrasonic probe 83 are connected to each other by a cable 84. The terminal device 82 and the ultrasonic probe 83 transmit and receive an electrical signal through the cable 84 from and to each other. The ultrasonic probe 83 includes a main body portion 85 and a probe head 86 attached to be detachable from the main body portion 85. The ultrasonic sensor 60 is provided in the probe head 86. The ultrasonic sensor 60 transmits a sonic wave (ultrasonic wave) from the surface thereof (surface illustrated in FIG. 12) toward a measurement target and receives a reflected wave from the measurement target. In this manner, the ultrasonic sensor measures a distance from the measurement target or detects the shape of the measurement target, for example. The ultrasonic sensor 60 has a configuration in which an element array 62 is formed on a base 61. The element array 62 is configured by arranging the piezoelectric elements 38. The arrangement is formed in a matrix of a plurality of rows and a plurality of columns. As illustrated in FIG. 13, the piezoelectric element 38 is configured with the second electrode 53, the first electrode 51, and the piezoelectric layer 52. The piezoelectric layer 52 is interposed between the second electrode 53 and the first electrode 51. The second electrode 53 functions as a common electrode for the piezoelectric elements 38, and the first electrode 51 functions as an individual electrode for each of the piezoelectric elements 38. The functions of the second electrode 53 and the first electrode 51 may be interchanged. That is, a lower electrode may be commonly provided for the piezoelectric elements 38 in the entirety of the matrix, and an upper electrode may be individually provided for each of the piezoelectric elements 38. Regarding the arrangement of the element array 62, for example, a configuration in which the position of the piezoelectric element 38 in a column is different from the position of the piezoelectric element in the adjacent column in a column direction can be employed. In this case, the group of piezoelectric elements 38 in the even-numbered columns may be arranged to be shifted from the group of piezoelectric elements 38 in the odd-numbered columns in the column direction by the half of the row pitch.

In the base 61, a first terminal array 68a and a second terminal array 68b are formed at positions which are one end side and the other end side of the piezoelectric element 38 in the column direction and are out of the element array 62, respectively. Each of the terminal array 68a and 68b includes a pair of common electrode terminals 69 disposed on both sides in the row direction and a plurality of individual electrode terminals 70 disposed between the common electrode terminals 69 on both the sides. The common electrode terminal 69 is electrically connected to the second electrode 53 of the piezoelectric element 38, and the individual electrode terminal 70 is electrically connected to the first electrode 51 of the piezoelectric element 38. A flexible wiring substrate (not illustrated) which is connected to a control circuit (not illustrated) of the ultrasonic diagnostic apparatus 81 is electrically connected to one end of each of the terminal arrays 68a and 68b. A driving signal Vdr and a reception signal VR as will be described later are transmitted and received between the control circuit and the ultrasonic sensor 60 through the flexible wiring substrate.

As illustrated in FIG. 13, the base 61 includes a substrate 72 and the diaphragm 36 in a state of being stacked on each other. More specifically, the diaphragm 36 is formed on one surface of the substrate 72. The plurality of pressure chambers C which respectively correspond to piezoelectric elements 38 are formed in the substrate 72, so as to be partitioned by the pressure-chamber substrate 34. That is, the pressure chambers C are arranged in an array with respect to the substrate 72, and the pressure-chamber substrate 34 is disposed between two pressure chambers C which are adjacent to each other. A portion of the diaphragm 36, which corresponds to an upper opening of the pressure chamber C functions as a movable region 78. The movable region 78 is a portion in which a portion (ceiling surface) of the pressure chamber C is divided and can vibrate (displace) in a thickness direction of the substrate 72. The substrate 72 and the diaphragm 36 are integrally formed. More specifically, a silicon oxide film ($SiO_2$) is formed by thermally oxidizing one surface of a silicon substrate as a base material of the substrate 72. Anisotropic etching treatment is performed on a region from the other surface of the silicon substrate to the silicon oxide film, and thereby the pressure chamber C is formed. The remaining silicon oxide film functions as the diaphragm 36. An insulating film (not illustrated) is stacked on the diaphragm 36. The piezoelectric element 38 is provided by stacking the first electrode 51, the piezoelectric layer 52, and the second electrode 53 on the front surface of the movable region 78 (on a surface which is opposite to a surface on the pressure chamber C side) in this order.

A reinforcing plate 76 is bonded to the back surface of the base 61 (opposite surface of the diaphragm 36 side) by an adhesive 80. The reinforcing plate 76 closes the pressure chamber C on the back surface of the ultrasonic sensor 60. For example, a silicon substrate can be used as the reinforcing plate 76.

In the ultrasonic sensor 60, the driving signal Vdr output by the control circuit is supplied (applied) to the first electrode 51 of each of the piezoelectric elements 38 via the individual electrode terminal 70, in a transmission period (vibration period) in which ultrasonic waves are transmitted. The reception signal VR from the piezoelectric element 38 is output through the first electrode 51 and the individual electrode terminal 70 in a reception period (vibration period) in which a reflected wave (echo) of the ultrasonic wave is received. A common voltage VCOM is supplied to the second electrode 53 of each of the piezoelectric element 38 via the common electrode terminal 69. The common voltage VCOM is a constant DC voltage. If a voltage corresponding to a difference between the driving signal Vdr and the common voltage VCOM is applied to each of the piezoelectric elements 38, an ultrasonic wave having a predetermined frequency is transmitted from the piezoelectric element 38. Ultrasonic waves which are respectively radiated from all the piezoelectric elements 38 are synthesized to form an ultrasonic wave radiated from the element array surface of the ultrasonic sensor 60. The ultrasonic wave is transmitted toward a measurement target (for example, inside of a human body). If the ultrasonic wave is transmitted, and then a reflected wave from the measurement target is input to the piezoelectric element 38, the piezoelectric element 38 vibrates as a detection vibration unit in accordance with the input reflected wave, and thus an electromotive force is generated. The electromotive force is output to the control circuit as the reception signal VR. The group of piezoelectric elements functioning as the detection vibration units alternately performs transmission of a sonic wave and reception of a reflected wave at different times.

What is claimed is:

1. A liquid discharge head comprising:
a pressure chamber that accommodates a liquid;
a diaphragm that forms a wall surface of the pressure chamber; and
a piezoelectric element that is provided on an opposite side of the pressure chamber with the diaphragm interposed between the piezoelectric element and the pressure chamber and vibrates the diaphragm,
wherein the diaphragm includes a silicon oxynitride layer and a silicon thermal oxide layer, the silicon oxynitride layer including silicon oxynitride, and the silicon thermal oxide layer including silicon oxide, and
wherein the silicon oxynitride layer is disposed between the piezoelectric element and the silicon thermal oxide layer.

2. The liquid discharge head according to claim 1,
wherein the diaphragm includes a silicon nitride layer which is formed of silicon nitride and is stacked on the silicon oxynitride layer.
3. The liquid discharge head according to claim 2,
wherein the silicon oxynitride layer is stacked between a polysilicon layer formed by polysilicon and the silicon nitride layer.
4. A liquid discharge apparatus comprising:
the liquid discharge head according to claim 3.
5. A liquid discharge apparatus comprising:
the liquid discharge head according to claim 2.
6. The liquid discharge head according to claim 1,
wherein the diaphragm includes an adhesive layer positioned on an outermost layer on the piezoelectric element side, and
the adhesive layer is formed on a surface of the silicon oxynitride layer which is formed with including the silicon oxynitride and is provided in the diaphragm.
7. A liquid discharge apparatus comprising:
the liquid discharge head according to claim 6.
8. The liquid discharge head according to claim 1,
wherein the piezoelectric element is formed on a surface of the silicon oxynitride layer which is formed with including the silicon oxynitride and is provided in the diaphragm.
9. A liquid discharge apparatus comprising:
the liquid discharge head according to claim 8.
10. The liquid discharge head according to claim 1,
wherein a linear expansion coefficient of the silicon oxynitride layer is from $1.0 \times 10^{-6}$/K to $2.0 \times 10^{-6}$/K.
11. A liquid discharge apparatus comprising:
the liquid discharge head according to claim 10.
12. The liquid discharge head according to claim 1,
wherein a linear expansion coefficient of the silicon oxynitride layer is from $1.5 \times 10^{-6}$/K to $2.0 \times 10^{-6}$/K.
13. A liquid discharge apparatus comprising:
the liquid discharge head according to claim 12.
14. The liquid discharge head according to claim 1,
wherein a percentage of a mass of nitrogen to the total mass of oxygen and the nitrogen in the silicon oxynitride layer is from 20% to 90%.
15. A liquid discharge apparatus comprising:
the liquid discharge head according to claim 14.
16. A liquid discharge apparatus comprising:
the liquid discharge head according to claim 1.
17. A piezoelectric device comprising:
a diaphragm that forms a wall surface of a pressure chamber; and
a piezoelectric element that is provided on an opposite side of the pressure chamber with the diaphragm interposed between the piezoelectric element and the pressure chamber and vibrates the diaphragm,
wherein the diaphragm includes a silicon oxynitride layer and a silicon thermal oxide layer, the silicon oxynitride layer including silicon oxynitride, and the silicon thermal oxide layer including silicon oxide, and
wherein the silicon oxynitride layer is disposed between the piezoelectric element and the silicon thermal oxide layer.
18. An ultrasonic sensor comprising:
the piezoelectric device according to claim 17.
19. A piezoelectric device comprising:
a pressure chamber that accommodates a liquid;
a diaphragm that forms a wall surface of the pressure chamber; and
a piezoelectric element that is provided on an opposite side of the pressure chamber with the diaphragm interposed between the piezoelectric element and the pressure chamber and vibrates the diaphragm, wherein the diaphragm includes a silicon oxynitride layer and a polysilicon layer, the silicon oxynitride layer including silicon oxynitride, and the polysilicon layer including polysilicon.

20. The piezoelectric device according to claim 19, wherein the diaphragm includes a silicon nitride layer which is formed of silicon nitride and is stacked on the silicon oxynitride layer, and wherein the silicon oxynitride layer is disposed between the polysilicon layer and the silicon nitride layer.

\* \* \* \* \*